· US005682673A

United States Patent [19]

Fehr

[11] Patent Number: 5,682,673
[45] Date of Patent: Nov. 4, 1997

[54] METHOD FOR FORMING ENCAPSULATED IC PACKAGES

[75] Inventor: Gerald K. Fehr, Cupertino, Calif.

[73] Assignee: IPAC, Inc., San Jose, Calif.

[21] Appl. No.: 424,151

[22] Filed: Apr. 17, 1995

[51] Int. Cl.$^6$ .................................................. H01R 43/00
[52] U.S. Cl. ...................... 29/827; 29/841; 264/272.15; 257/696; 174/52.4
[58] Field of Search ..................... 29/827, 856, 841; 264/272.15, 272.17, 278; 257/676, 696; 174/52.4, 52.5, 52.6

[56] References Cited

U.S. PATENT DOCUMENTS

| 4,751,611 | 6/1988 | Arai et al. ........................... 361/385 |
| 4,783,428 | 11/1988 | Kalfus ................................ 29/841 |
| 4,803,030 | 2/1989 | Kobayashi ....................... 264/272.15 |
| 5,218,759 | 6/1993 | Juskey et al. ................... 264/272.17 |
| 5,224,021 | 6/1993 | Takada et al. ..................... 257/696 |

Primary Examiner—P. W. Echols
Assistant Examiner—Adrian L. Coley
Attorney, Agent, or Firm—Donald R. Boys

[57] ABSTRACT

A mold is provided for use in encapsulating integrated circuit (IC) dies attached to die attach pads of lead frames, wherein the mold has one or more support elements in cavities of the mold for supporting the die attach pad portions of the lead frame while the mold is closed on the lead frame and encapsulation material is injected to encapsulate the IC dies and die attach pads. The support elements are, in a preferred embodiment, pins extending from the surfaces of the cavities in the mold, and the pins keep the die attach pads from moving into contact with surfaces of the cavities, so die attach pads or dies are not exposed in finished packages. In a preferred embodiment the pins each are tapered in the extended portion, so the amount of exposure of the die attach pad is absolutely minimized. In another embodiment, the support elements are retractable. In still other embodiments, support elements are beads bonded to a lead frame strip or dimples provided to a lead frame strip in the process of manufacturing the strip. Methods for practicing the invention are provided as well.

12 Claims, 9 Drawing Sheets

METHOD FOR FORMING ENCAPSULATED IC PACKAGES

FIELD OF THE INVENTION

The present invention is in the area of integrated circuit (IC) manufacturing, and pertains in particular to apparatus and methods for encapsulating integrated circuits on lead frames to form IC packages with leads for mounting to electronic circuitry.

BACKGROUND OF THE INVENTION

In general, the plastic encapsulation of ICs to form packages ICs with electrical leads is as follows: Typically, ICs in die form are attached to mounting areas called islands, or die attach pads, on strips called lead frames. In this specification the die attach pad terminology will be used. The lead frames are made of a thin, flat, electrically conductive material and typically have several individual die attach pads, each for supporting an individual IC during a molding operation wherein the individual dies are encapsulated in plastic material, leaving electrical leads protruding from the plastic encapsulation.

In many cases, densely packaged ICs are manufactured to maximize connectivity by utilizing all four sides of the chip. Around the perimeter of each die attach pad a typical lead frame has a pattern of individual conductive leads extending toward, but not contacting, the die attach pad. The die attach pads and individual leads are formed by selective removal of material in the lead frame, such as by stamping. The number of the leads at a frame with a single die attach pad depends directly on the configuration of the particular IC die to be mounted, this is, the number and location of electrical terminations to the die.

A typical IC may have over one hundred or more external terminations, and each frame will have a corresponding number of individual leads. The width of each lead and the separation between adjacent leads is dependant, among other things, on the package size of the finished IC. The thickness of each lead is the thickness of the lead frame and is predicated on the current carrying capacity required.

A plastic package with external leads for connecting to, for example, a printed circuit board, is typically formed by an encapsulation process. Mating molds are placed on each side of the lead frame and liquid-phase polymer is injected to encapsulate IC dies attached to the die attach pads in each frame. The lead frame is designed to dam the flow of liquid-phase polymer as it moves to the outer edges of each individual mold, stopping at the points where each mold contacts surfaces of the lead frame. To stop the flow of liquid-phase polymer between leads the lead frame has a pattern of dam bars between individual leads, so a contiguous band of material is formed around the periphery of the island. This contiguous band prevents the polymer from flooding the entire leadframe, and also allows the lead frame to be one contiguous piece of material until subsequent trimming operations are performed.

After the polymer solidifies and the molds are removed, a following operation in the manufacturing process removes the excess plastic in the region around the mold outline and the dam bars. This is termed de-junking in the art. A de-damming process then removes the dam bar between each lead, providing electronic integrity for each lead. De-damming is a process of removing all or part of each dam bar by use of a punch with a pattern of teeth conforming to the pattern of the dam bars in the lead frame. Typically, the de-damming and de-junking can be done in a single step.

In following processing each lead exposed from the edge of the plastic package is further treated such as by plating, and the individual packages are trimmed from the lead frame strip. Finally, the leads are formed, such as for Surface Mount Technology (SMT) applications.

In state-of-the-art manufacturing, automated machines are used to perform the encapsulation process. Automated machines are marketed by a number of manufacturers, including several Japanese manufacturers, and include molds made to close over one or more lead frames, as described above, whereinafter an encapsulation material is injected and caused to solidify. The encapsulation material is typically a liquid-phase polymer material.

In the encapsulation process, the molds are typically designed to minimize the amount of material that must be injected. As a result, typical dimensions from the inside surface of a formation cavity of an upper half of a mold to the top of a die attached to a die attach pad, and from the inside surface of a formation cavity of a lower half of a mold to the underside of a die attach pad during injection of the liquid-phase polymer while the halves of the mold are closed, are relatively small. A typical dimension for these planned clearances is about 0.010 inches, which is about a quarter of a millimeter.

For a number of reasons, among them gravity, flow path of injected polymer, and native distortion of lead frames before insertion in a molding machine, the die attach pad to which a die is attached sometimes contacts the inside cavity surface of one of the mold halves, most usually the lower half of the mold, and after solidification of the polymer and trimming operations, individual packaged ICs are discovered to have exposed die attach pads in the package. These defective packages are rejects. It is believed that the principal villain in this failure mode is the location of points of injection of liquid-phase encapsulation material, together with the mold design, which determines the path of liquid phase material when filling the molds. The moving material flows against the lead frame and tends to alter the position of the die attach pads, and, of course the dies attached to them.

This defect is particularly problematic in encapsulation of relatively thin packages, such as those with a package thickness 1.4 mm thick and below, and those packages, including these thin packages, where the ratio of the horizontal area of the package to the thickness of the package is relatively high. The problem is also more noticeable for those packages that are subject to relatively high stress during mounting to a printed circuit board.

Relatively frequent occurrence of this defect demands rigorous inspection procedures to find the defective packages, and the net loss is a relatively expensive proposition in IC packaging operations.

What is clearly needed is apparatus and a method to ensure that a positive gap is maintained from dies and die attach pads to nearby mold surfaces during the time that liquid-phase polymer is injected and the time the polymer is solidified, such that liquid polymer can be always expected to fill the space so formed, and to solidify leaving an even thickness of solid polymer material between the die attach pad and attached die and nearby mold surfaces, so a finished package does not have any exposed surface of the die or the die attach pad.

SUMMARY OF THE INVENTION

In a preferred embodiment, a method is provided for molding an integrated circuit (IC) package, comprising steps of (a) attaching an IC die to a die attach pad of a lead frame; (b) bonding wires from the IC die to leads of the lead frame; (c) placing the lead frame between an upper and a lower portion of a mold having matching mold cavities for forming an encapsulation volume around the lead frame and attached IC die; (d) providing a support element in one of the mold cavities for spacing the die attach pad and attached die from an adjacent surface of the one of the mold cavities; (e) closing the portions of the mold on the lead frame such that the die attach pad and attached die is spaced from the adjacent surface; and (f) injecting encapsulation material into the encapsulation volume.

In one embodiment the support element is a single element positioned substantially in the center of the mold cavity in the lower mold portion when the mold portions are closed, and the support element so positioned may be a dimple provided in the die attach pad of the lead frame, or a bead of material affixed to the die attach pad. In another embodiment the support element is a pin engaged in a hole provided for the purpose in the mold cavity in the lower mold portion, the pin having an extended portion extending into the mold cavity. The pin may be tapered on the extended portion to minimize contact area with a lead frame strip.

In other embodiments there are plural support elements, and elements may be made to be retractable, so the support elements may be retracted after injection, allowing encapsulation material to also fill the volume occupied by the support elements before retraction.

Supporting the die attach pad during the molding operation for encapsulating IC packages ensures that die attach pads will not move during the molding operations and be exposed in finished packages, significantly reducing the reject rate for such operations.

DESCRIPTION OF THE PREFERRED EMBODIMENTS

Figure 1:
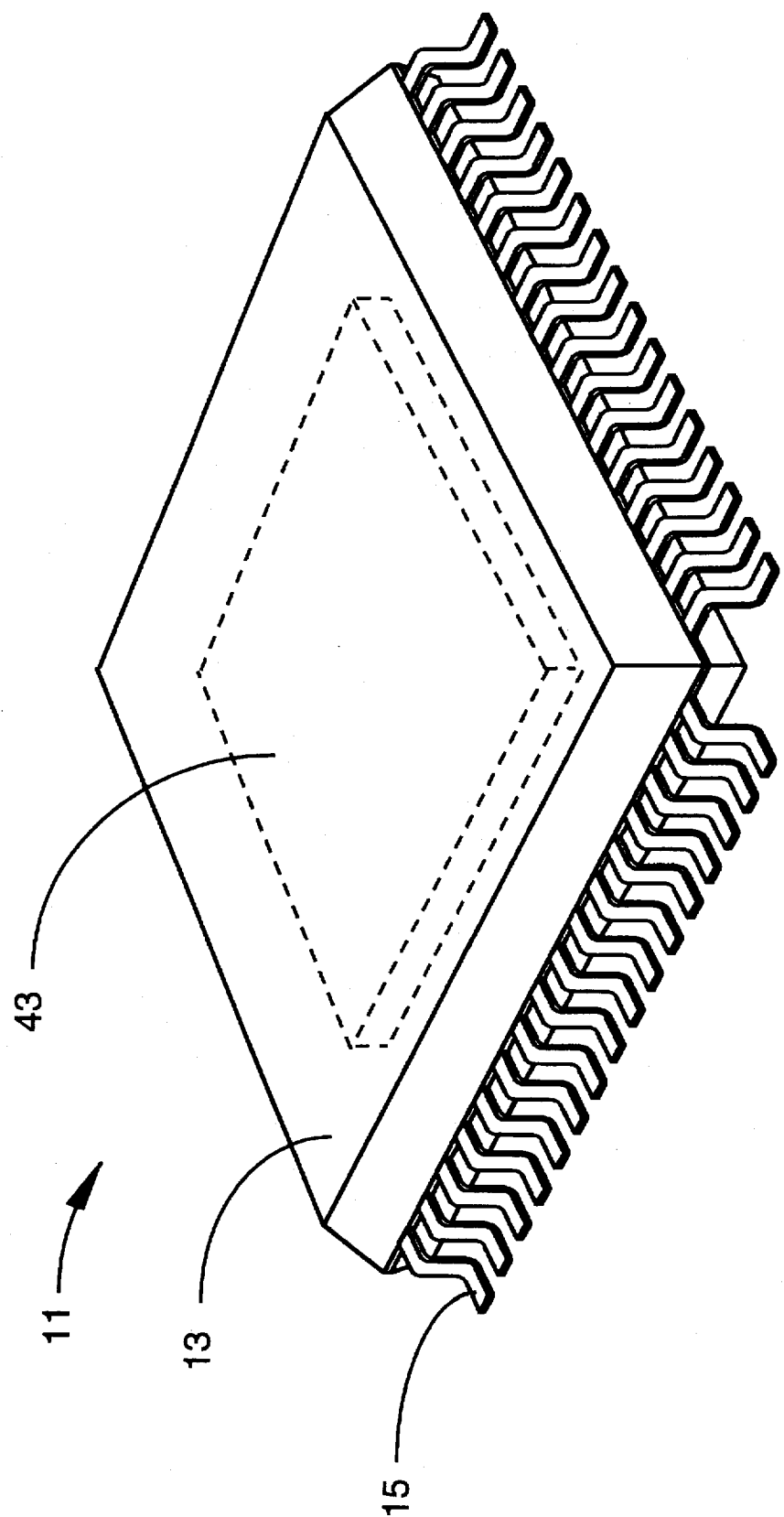
FIG. 1 is an isometric view of a Quad IC package in the prior art.

FIG. 1 is an isometric view of a conventional QFP IC package 11. Typically, body 13 of IC package 11 is formed of plastic material by a method of transfer molding. Die 43 is inside, and completely encapsulated by the plastic molded body. The die contains the circuitry that defines the electrical functions of a particular IC, and the circuitry of the IC is connected to the outside environment through individual conductive leads 15. The leads, as show by this example, are formed into J-bends for surface mount technology (SMT) application in another process. The leads are typically formed from a highly conductive material that is receptive to bending and forming while maintaining structural integrity. The molded package protects the sensitive and fragile circuitry on the IC die and fixes the arrangement of individual leads.

Figure 2:
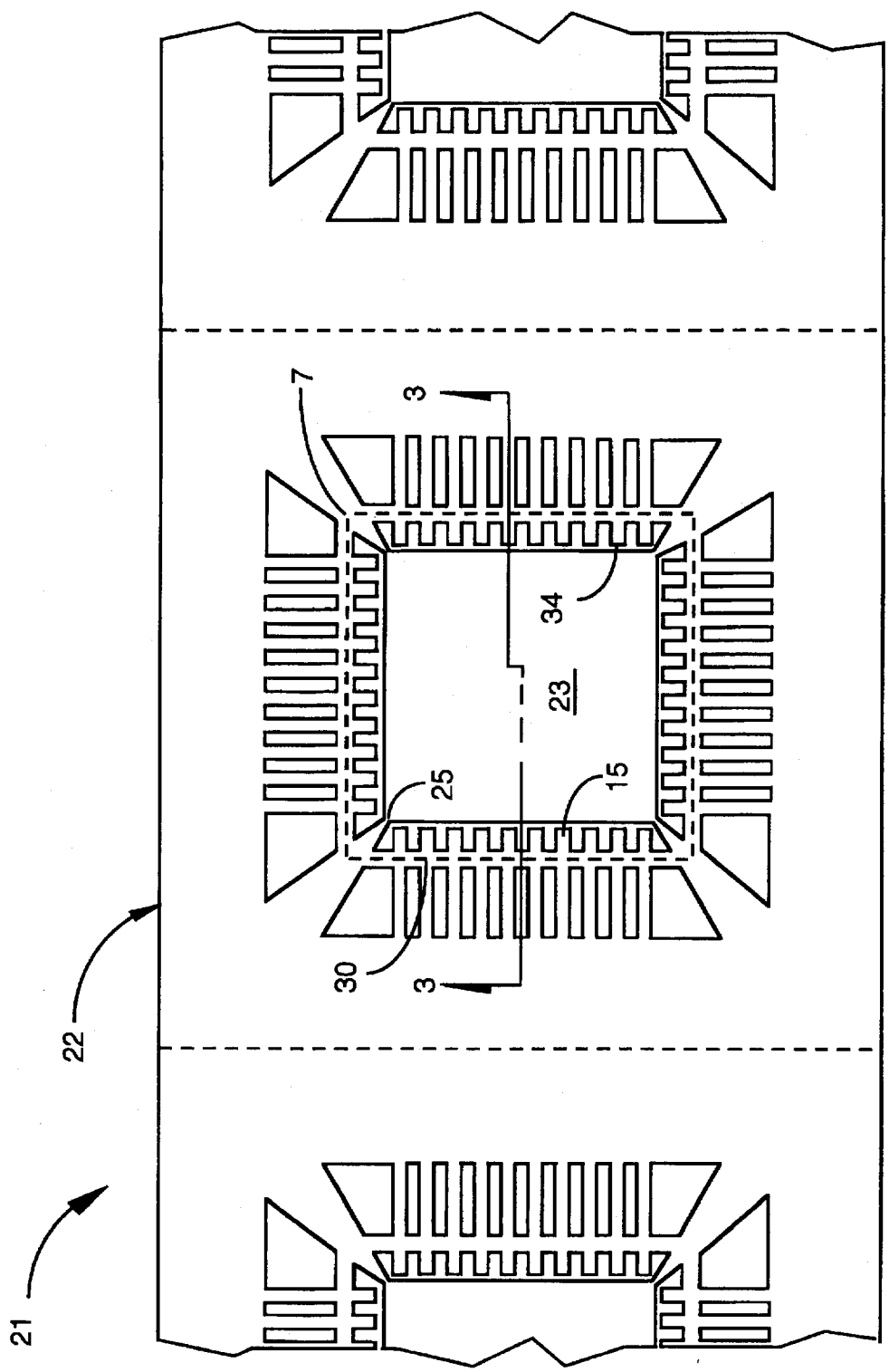
FIG. 2 is a somewhat idealized plan view of a portion of a lead frame in the prior art.

FIG. 2 is an idealized plan view of one frame 22 of a typical lead frame strip 21 before the process of die attach and encapsulation. Strip 21 comprises several lead frames identical to frame 22 whereon individual IC packages are constructed. The layout of FIG. 2 is intentionally simplified to illustrate the principles involved. As is well-known in the art, different lead frames for differently-designed dies typically have a different number of die attach pads in a strip. The lead frames are made of a conductive material, typically a malleable metal material, and formed in thin sheets. The sheet thickness of lead frame strip 21 provides the thickness of the resulting leads from a finished IC package.

In the example of lead frame 22, a plurality of leads 15 are provided approaching, but not contacting, die attach pad 23. Gap 34 serves to electrically isolate die attach pad 23 from each lead. Die attach pad 23 is supported in this example by legs 25 that are contiguous to lead frame strip 21, typically formed to attach at the corners of the island. Lead frame 22 also defines the outer edges of the plastic encapsulation by means of structures between leads 15 to stop the flow of the liquid-phase polymer in the encapsulation process. These structures comprise dam bars 30, and their placement between leads provides a contiguous strip of material around each island, illustrated by broken line 7.

The necessity for dam bars 30 means that at this stage all leads 15 surrounding island 23 are electrically connected to one another. The dam bars are subsequently removed (after encapsulation) by trimming punches in a separate process. The later removal of the dam bars provides electrical isolation from each lead to the others.

In a die attach process, individual IC dies are affixed to each die attach pad, substantially centered and aligned so the four edges of the die at each frame are parallel to the edges of the die attach pad of the lead frame. In this process, conductive wires are bonded from each contact termination along each of the four edges of the die to the corresponding leads along the four edges of the die attach pad. These wires form the electrical connection in a finished IC package from the circuitry in the integrated circuit to the electrical leads that are subsequently bonded to circuitry and other devices on a printed circuit board.

Figure 3:
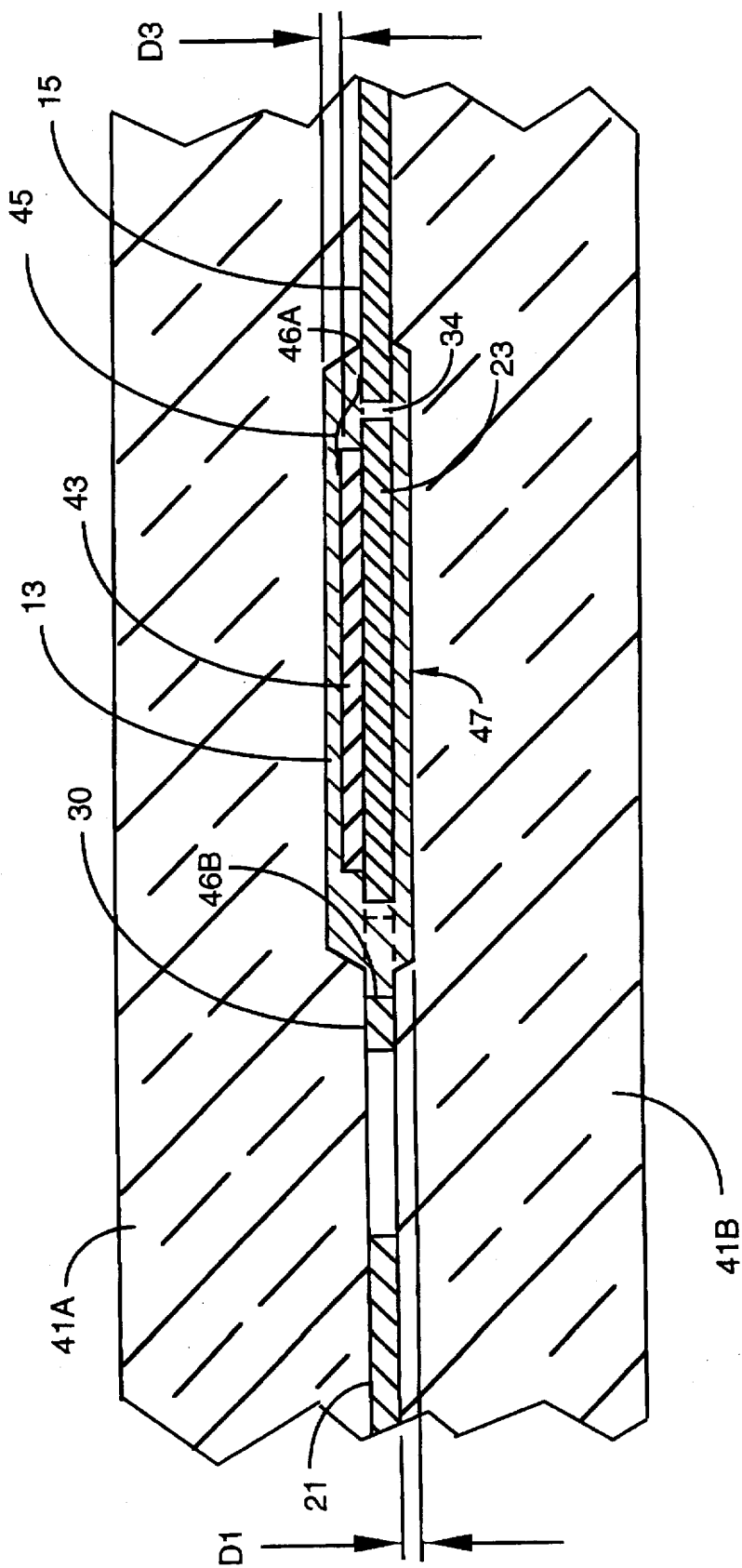
FIG. 3 is an elevation section view of a lead frame with die attached, and with a mold closed on the lead frame, as in the prior art, taken generally along the line 3—3 of FIG. 2.

FIG. 3 is a cross-sectional view of lead frame 21 taken along section line 3—3 of FIG. 2 after die placement, wire bonding, and encapsulation, with the encapsulation mold in place and filled with polymer 50. IC die 43 is shown attached to die attach pad 23 and wires 45 are bonded between each contact pad in the die and its corresponding lead. Wires 45 span gap 34 between each mounting pad on the IC die and its respective lead.

After die attach and wire bonding, lead frame strip 21 is positioned between two opposing, typically symmetrical molds portions 41A and 41B. Within the body of each of the portions of the mold, at each cavity, there is typically one or more passages into a cavity for entry of injected liquid-phase polymer and one or more passages for bleeding off displaced air. These passages are not shown in FIG. 3, but are typically located at the corners of the molds. Further, the passages may be in either or both of the portions of the mold, and may vary in number for molds intended for different lead frames and packages. The location of the passages is an important characteristic in the flow characteristic in mold filling, which is believed to strongly influence the way die attach pads may move in the molding process.

Molds 41A and 41B are positioned and centered on each die 43, and liquid-phase polymer is injected and flows until it (hopefully) fills all of the volume around the die and the die attach pad. When the polymer has solidified, molds 41A and 41B are removed and lead frame strip 21, with the encapsulated and bonded die 43, is ready for trimming to produce individual IC packages.

In FIG. 3, dimensions D1 and D3 represent the clearances between the die attach pad or the IC die, and adjacent, nearby mold surfaces, which are, in this example, the bottom surfaces of the cavities of each of the upper and lower mold portions. These dimensions, to minimize material usage, as described above, may be as small as 0.010 inch, or sometimes even less. As also described above, there are a number of agents of distortion, such as prestressed lead frame material, the forces induced by the flow of polymer material into the closed mold, and the force due to ever-present gravity. The result is that the die attach pad is sometimes moved to contact the inside surface of one of the cavities in one of the portions of the mold, such as inside surface 47 of lower mold 41B. When this happens, and the polymer material solidifies with the die attach pad thus out of position, the resulting package has an exposed die attach pad or die, and is a reject.

Figure 4A:
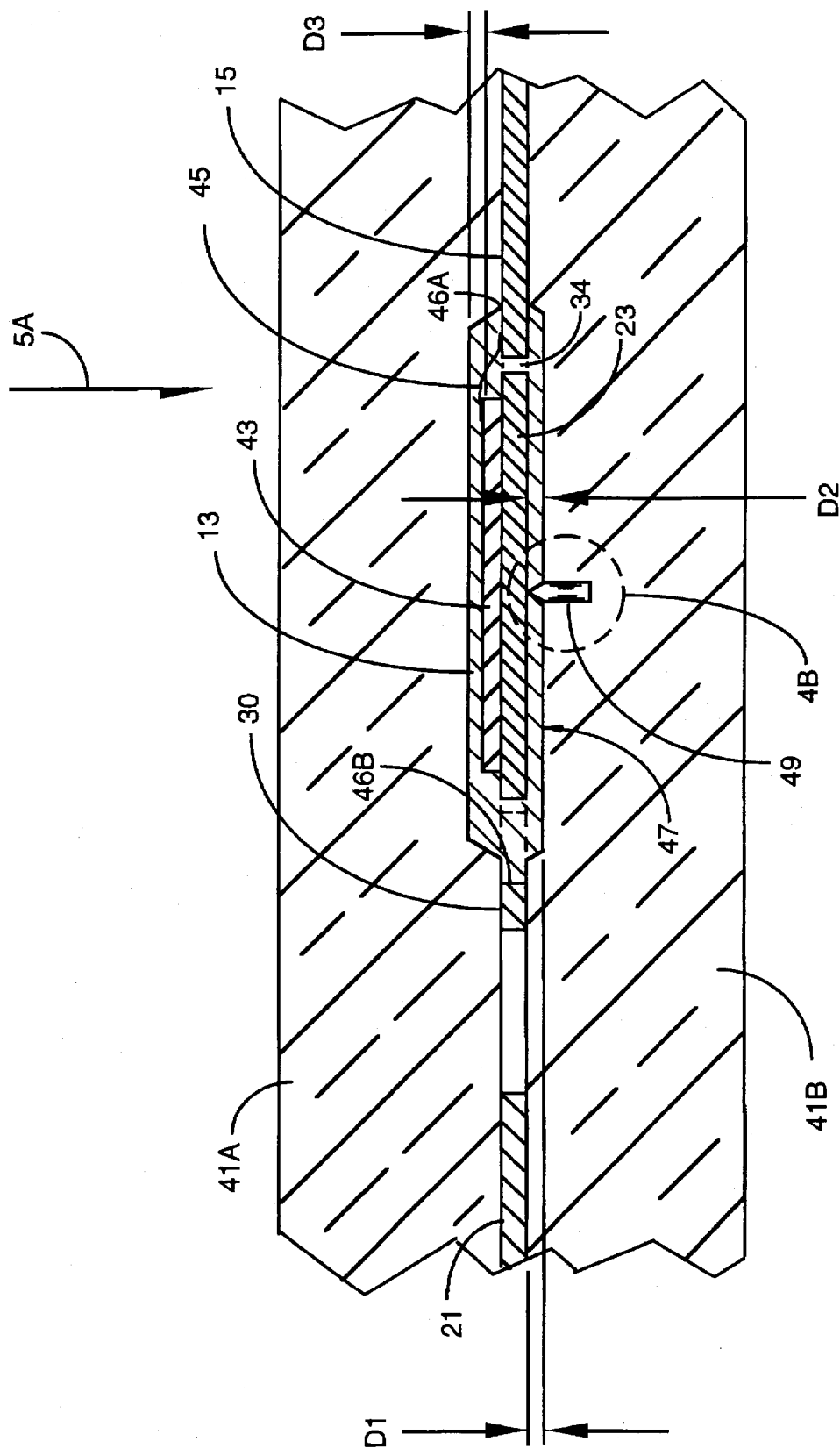
FIG. 4A is an elevation cross section similar to FIG. 3, showing a mold closed on a lead frame in an embodiment of the present invention.

FIG. 4A is a cross section of a mold set closed on a lead frame, similar to the cross section of FIG. 3, but according to an embodiment of the present invention. This embodiment of the invention is intended for those situations in which the failure mode is exposure of the die attach pad at what is considered the bottom of the resulting package.

In this embodiment, the lower half of the mold, on the inside bottom surface 47 of each of the cavities of the mold, has at least one extended support element 49 having protrusion distance D2 equal to D1. In one embodiment, there is a single support element 49, centrally located in the mold cavity, and die attach pad 51 is supported by being urged against this element during injection of the liquid-phase polymer. In other preferred embodiments there are more such support elements, arranged in a typically regular pattern, extending from surface 47. More than one, for example, four, support elements have been found to be advantageous for use with many wide-area, thin packages.

Figure 4B:
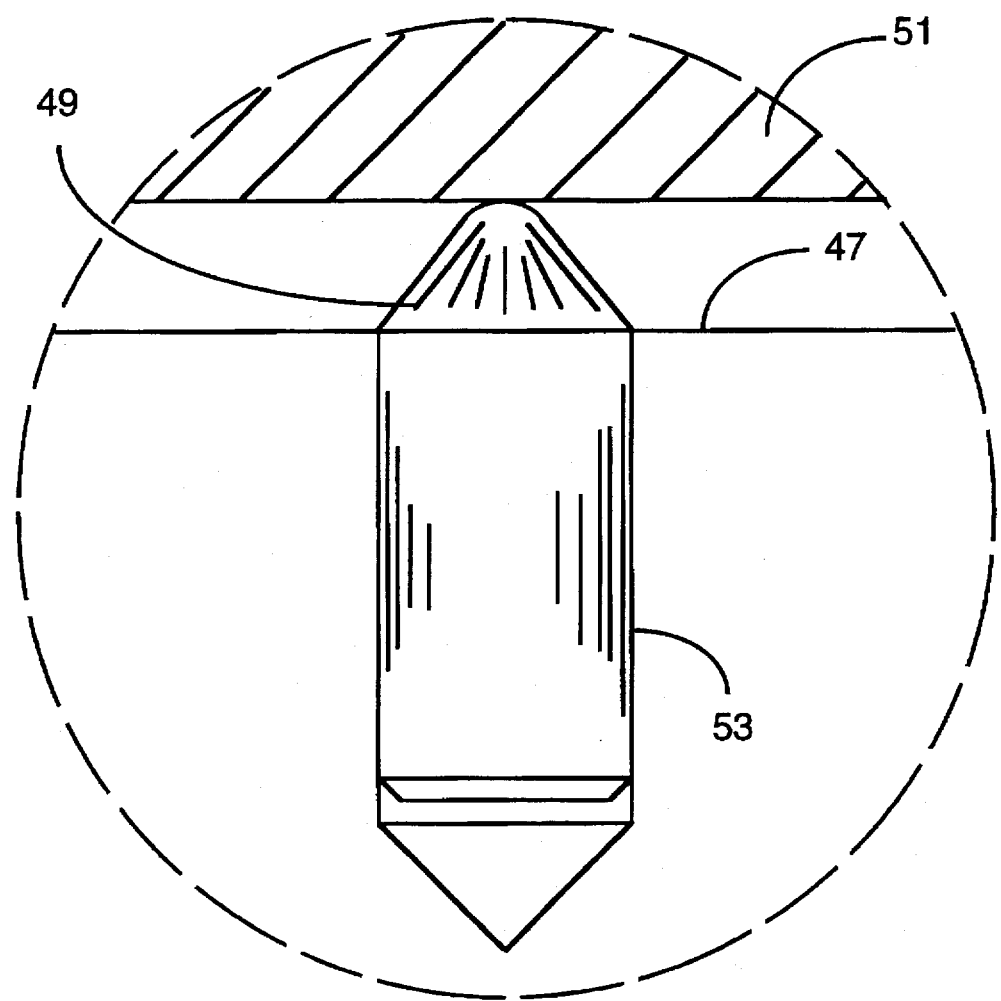
FIG. 4B is an enlargement of the area of FIG. 4 enclosed in a dotted circle and labeled "4B", showing the support extension according to an embodiment of the present invention.

FIG. 4B is an enlargement of the area in the dotted circle labeled 4B in FIG. 4A, showing the shape of support element 49, which is a cylindrical pin having a diameter of about 0.010 inch, with one end engaged in a cylindrical hole 53 formed substantially perpendicular to surface 47 of the mold cavity, for the purpose of engaging and retaining the support element (pin).

In this embodiment, the hole is made about 0.001 inch larger in diameter than the pin, so the pin is easily engaged in the hole, and the pin is silver-soldered into the hole. It has been found that making the hole smaller, and forcing the pin in the hole is generally not satisfactory, because the pin is quite small and subject to damage in forced insertion. It will be apparent to those with skill in the art that there are a number of other ways the support pin might be installed, and a number of ways the pin may be bonded in the hole.

As seen in FIG. 4A, the exposed length of support pin 49 after insertion in the lower die cavity (about 0.010 inch in this embodiment) is tapered to a generally conical shape, ending in a rounded end, to support die attach pad 51 in the encapsulation process. The tapered aspect presents a very small area for contact with the die attach pad, tending to minimize possible exposure of the die attach pad at the point of support after solidification of the injected polymer and removal of the encapsulated lead frame from the mold. The somewhat rounded end is provided because it was found in practice that a sharp pointed-pin tended to wear relatively more quickly than a rounded end, which shortens the extension (protrusion) length of the support pin. It has been found in practice that there is essentially no exposure after removal, because some small amount of polymer material intrudes into the area between the support and the die attach pad.

Figure 5A:
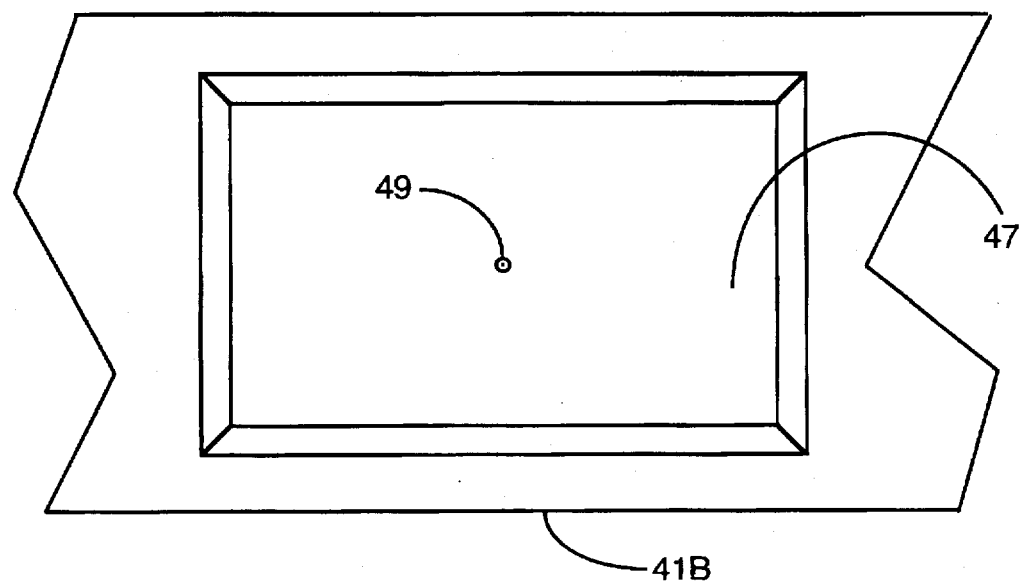
FIG. 5A is a plan view of the lower portion of a mold as seen in the direction of arrow "5A" of FIG. 4A.
Figure 5B:
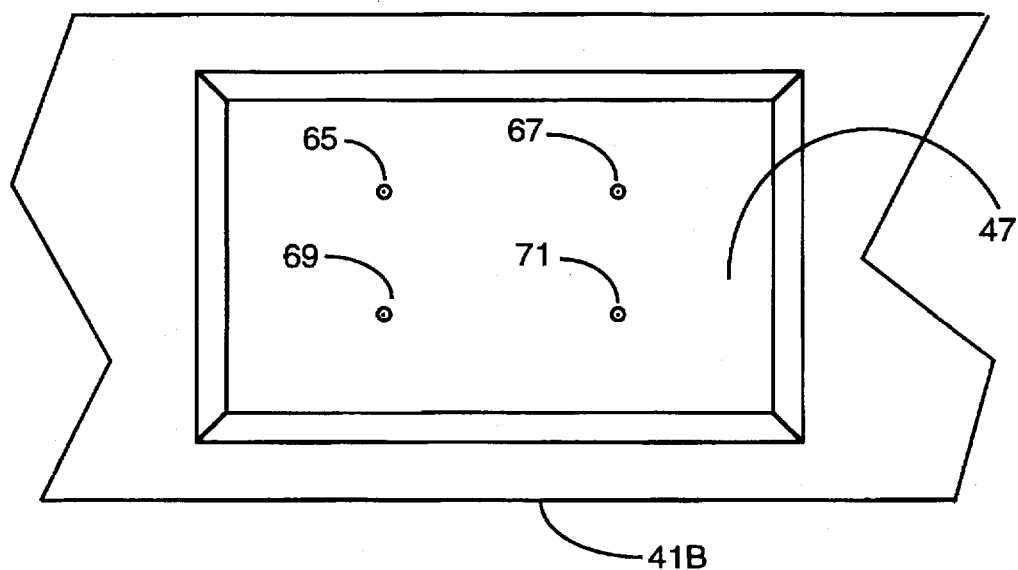
FIG. 5B is a plan view similar to FIG. 5A showing support pins.

FIG. 5A is a plan view of one lower mold cavity for a mold according to the present invention, in the direction of arrow 5A of FIG. 4A. Pin 49 is shown substantially in the center of the cavity, where it will support the die attach pad in the encapsulation process at approximately the center of the die attach pad. FIG. 5B is a plan view similar to FIG. 5A, showing four support pins 65, 67, 69, and 71 arranged in a rectangular array extending from surface 47 of the mold cavity of mold portion 41B. The four-pin approach has been found in practice to be preferable, especially for wide area, thin packages, but there are situations in which one support pin will do.

Figure 6A:
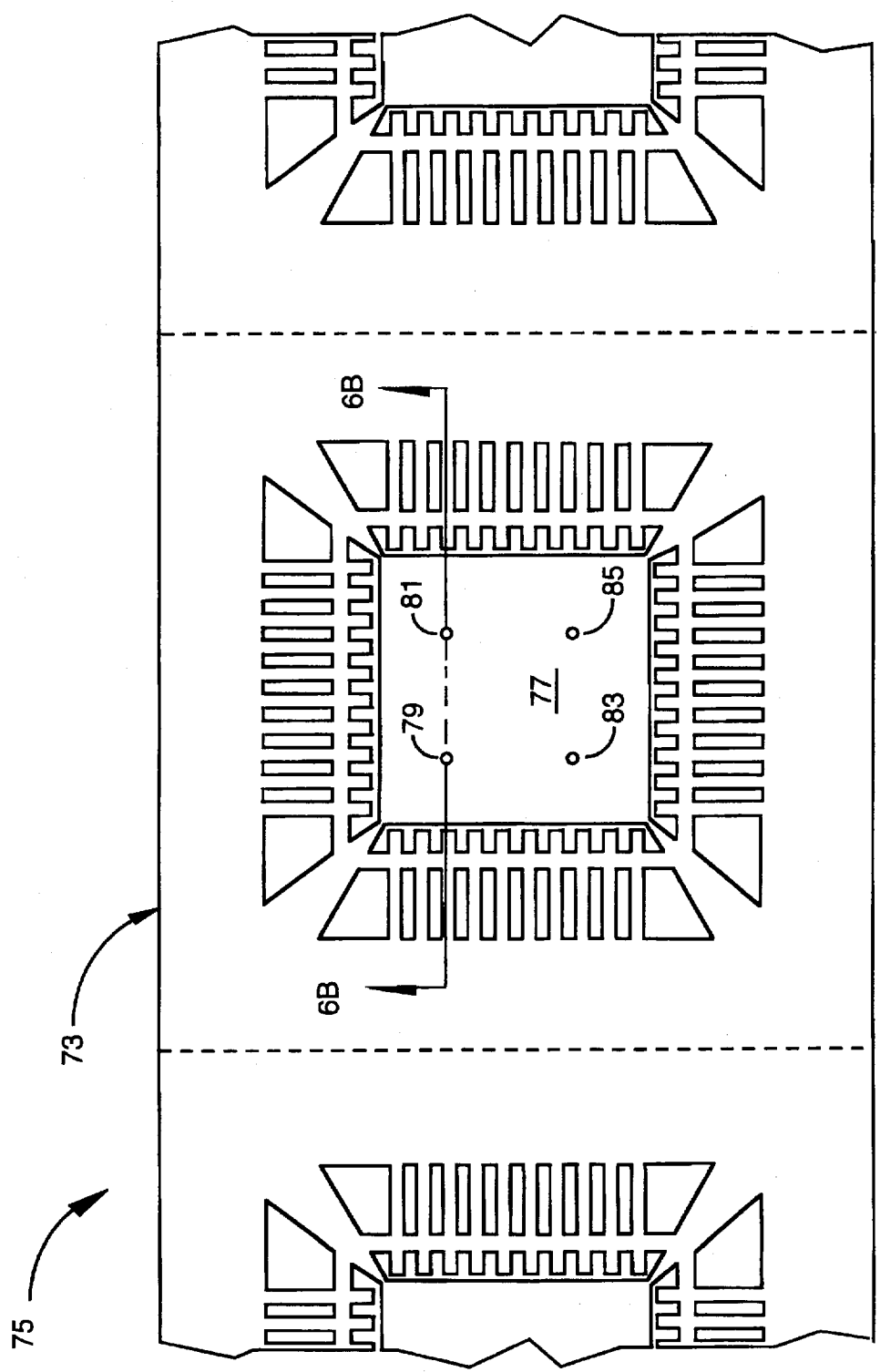
FIG. 6A is plan view of a lead frame strip similar to FIG. 2, but illustrating a strip in an embodiment of the present invention.

In an alternative embodiment of the invention, support for positioning the die attach pad in a closed mold is provided by alteration of the lead frame, rather than of one or the other of the portions of the mold. FIG. 6A is a plan view of a lead frame 73 in a lead frame strip 75, having a die attach pad 77 in very much the same shape as pad 23 of FIG. 2. In die attach pad 77, in the stamping process of manufacturing the lead frame strip, four small dimples 79, 81, 83, and 85 have been provided.

Figure 6B:
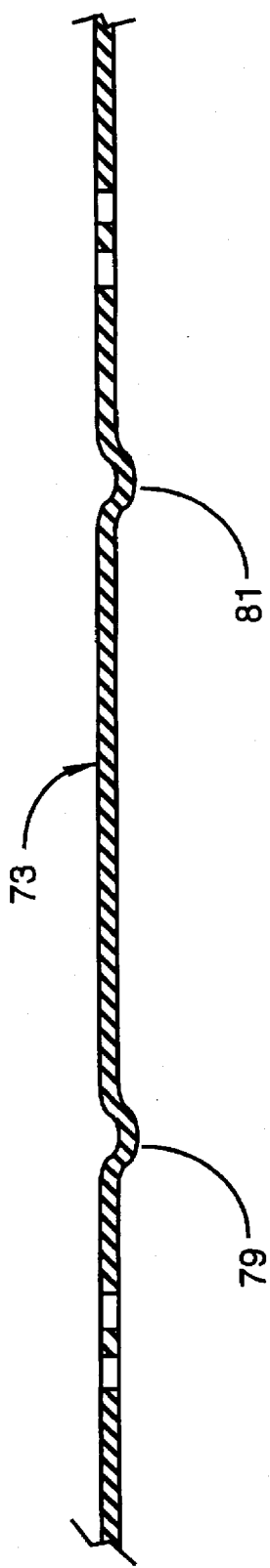
FIG. 6B is a section view of the lead frame strip of FIG. 6A taken along line 6B—6B of FIG. 6A.

FIG. 6B is a cross-section of frame 73 along the section line 6B—6B of FIG. 6A, intersecting two of the four dimples in the die attach pad, illustrating the depth of the dimples in the direction orthogonal to the plane of the die attach pad. Dimension D4 in this case is the same as the extension distance of the support pins in other embodiments described above. It should be remembered that some dimensions are exaggerated in these figures to provided clear description of certain features of the invention. It will be apparent to those with skill in the art that there are other ways to provide a support for the die attach pad during injection, such as by bonding small particles of material, for example plastic beads, to a die attach pad before use. In this method, the beads are encapsulated and become a part of the finished package. The bonding of such beads to a pad, however, is considered by the inventor to be a more troublesome process than dimpling the lead frame. And dimpling the lead frame is generally less desirable than using supports in the mold cavities, because the mold cavities need by altered only once for a large number of lead frames.

In the embodiments described thus far herein, support has been provided in all cases between a die attach pad and a surface of a lower mold portion, that is, on the side of an enclosed lead frame strip away from the die attached to a die attach pad. In some embodiments, however, the die attach pad may be urged upward, that is, toward the die contacting the surface of the cavity in the upper mold portion. It has been contemplated by the inventors, in fact, to alter the injection flow pattern to cause this particular distortion pattern, and to thwart the failure mode by providing the support extensions on the inside surface of the upper mold portion rather than the lower. In this case, the extensions would not necessarily contact the die itself, but might be positioned to contact the die attach pad outside the area to which the die is attached. Dimples, beads, or other support elements might be provided on the die side of die attach pads on lead frames to accomplish the same purpose, according to the present invention.

Figure 7:
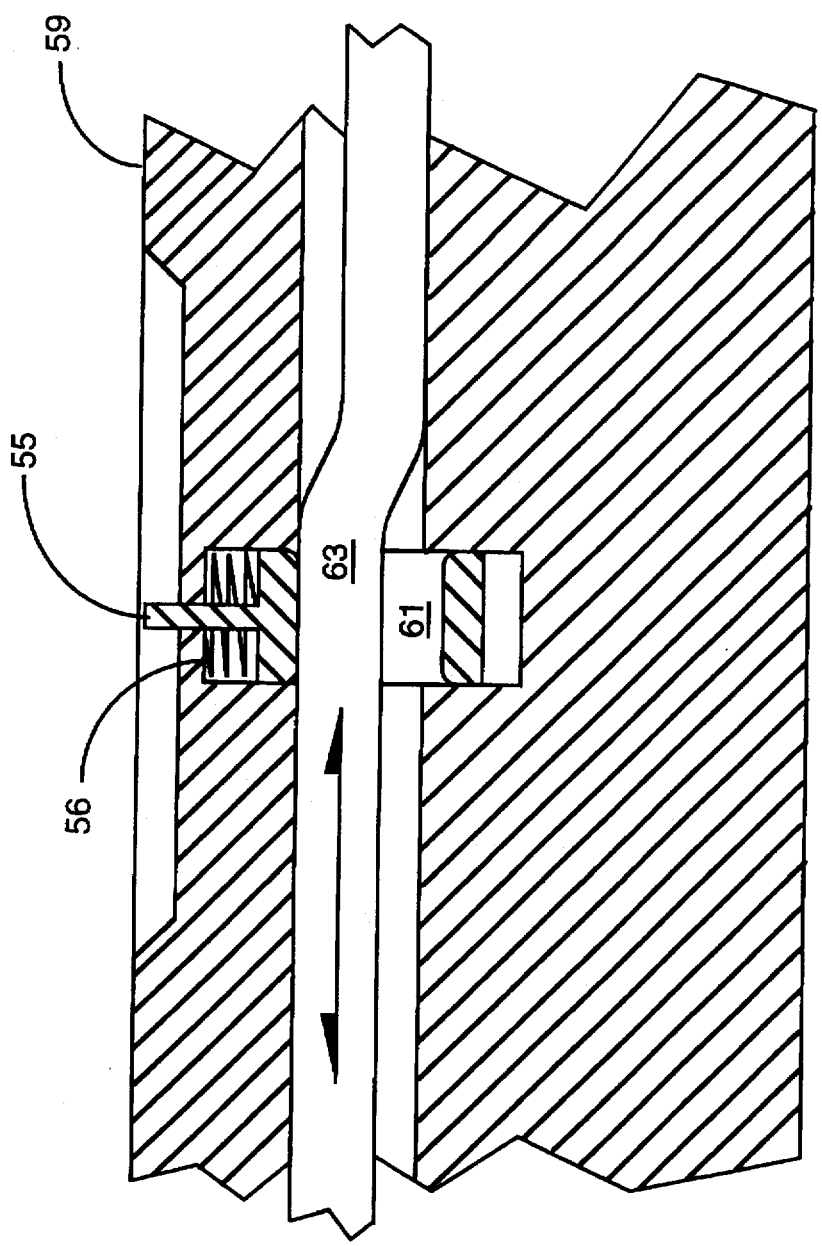
FIG. 7 is a section view of a lower half of a mold in an embodiment of the present invention, showing a retractable support element, and an apparatus for extending and retracting the support element.

For cases where no indention in the package is acceptable under any circumstance, retractable pins may be used in mold cavities. FIG. 7 is a cross section of a lower mold half 59 showing a retractable support pin 55. In this case, support pin 55 is not pointed at the upper end, but substantially flat, and extends into a hole with sufficient clearance that the pin may be retracted entirely into the hole.

In this embodiment, pin 55 has a second, and larger, diameter, with slot opening 61 through the pin at ninety degrees to the vertical axis of the pin. A cam bar 63 extends through this slot and is guided in another slot in lower mold half 59. Moving the cam bar in one direction extends pin 55 to the specified height to support a die attach pad during a molding injection operation, and moving the cam bar in the other direction retracts the support pin to a position wherein the upper end is flush with cavity surface 47. Spring 56 aids in retracting the pin. It will be apparent to those with skill in the art that there are a number of ways known in the mechanical arts that pins may be extended and retracted.

The pin in this embodiment retracts after liquid-phase polymer is injected and before it solidifies. At the time of retraction the mold is filled, and the presence of the polymer material tends to help support the die attach pad. After retraction, the polymer material hardens, and there is no hole of the sort left be a permanent pin. In other embodiments multiple retractable pins may be used.

It will be apparent to those with skill in the art that there are a number of alterations that might be made in details of the invention without departing from the spirit and scope of the invention. For example, there are many different package designs in the art, and the nominal clearance between a die attach pad or an attached die and the nearby surface of a mold cavity may be different for many of these designs. The length of a support element for the die attach pad would be matched substantially to this nominal dimension for each design. As another example, it was described above that one such support seemed to be sufficient for most purposes, but more than one support could be used in many cases. With plural supports there are also many possibilities for the placement and spacing of the supports. Just a few representative examples have been provided in this disclosure. There are also many shapes and forms a support might take other than the conical end shape described herein as a preferred embodiment. There are similarly many other alteration that might be made without departing from the spirit and scope of the invention.

What is claimed is:

1. A method for molding an integrated circuit (IC) package, comprising steps of:

(a) placing a lead frame having a die attach pad and an IC die attached thereto between an upper and a lower portion of a mold having mating mold cavities for forming an encapsulation volume around the lead frame and attached IC die;

(b) providing a support element in at least one of the mold cavities for spacing the die attach pad and attached die from an adjacent surface of one of the mold cavities, the support element providing contact to at least one of the IC die and die attach pad and to the adjacent surface in a manner allowing substantially all of the volume between the thusly spaced-apart elements to be filled with encapsulation material;

(c) closing the upper and lower portions of the mold on the lead frame such that the die attach pad and attached die is enclosed and spaced apart from the adjacent surface while providing space for encapsulation material to flow into the space created by the support element;

(d) injecting encapsulation material into the encapsulation volume; and (e) opening the upper and lower portions of the mold, thereby releasing the lead frame and leaving encapsulation material enclosing each attached IC die.

2. The method of claim 1 wherein the support element is a single element positioned substantially in the center of the mold cavity in the lower mold portion when the mold portions are closed.

3. The method of claim 2 wherein the support element is a dimple provided in the die attach pad of the lead frame.

4. The method of claim 2 wherein the support element is a bead of material affixed to the die attach pad.

5. The method of claim 2 wherein the support element is a pin engaged in a hole provided for the purpose in the mold cavity in the lower mold portion, the pin having an extended portion extending into the mold cavity.

6. The method of claim 5 wherein the pin is tapered on the extended portion.

7. The method of claim 1 wherein plural support elements are provided.

8. The method of claim 7 wherein the plural support elements are dimples provided in the die attach pad of the lead frame.

9. The method of claim 7 wherein the plural support elements are beads of material affixed to the die attach pad of the lead frame.

10. The method of claim 7 wherein the plural support elements are pins engaged in holes provided for the purpose in one of the mold cavities, the pins having each an extended portion extending into the mold cavity.

11. The method of claim 10 wherein the pins each are tapered on the extended portion.

12. The method of claim 1 wherein the support element is a retractable support element, and further comprising a step (e) for retracting the support element after the encapsulation material is injected, but before the encapsulation material solidifies.

* * * * *